United States Patent
Kim et al.

(10) Patent No.: US 7,214,559 B2
(45) Date of Patent: May 8, 2007

(54) METHOD FOR FABRICATING VERTICAL OFFSET STRUCTURE

(75) Inventors: Jong-pal Kim, Seoul (KR); Sang-woo Lee, Seoul (KR); Byeung-leul Lee, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 74 days.

(21) Appl. No.: 11/134,521

(22) Filed: May 23, 2005

(65) Prior Publication Data

US 2005/0266598 A1 Dec. 1, 2005

(30) Foreign Application Priority Data

May 21, 2004 (KR) .................... 10-2004-0036507

(51) Int. Cl.
*H01L 21/00* (2006.01)
(52) U.S. Cl. .................... 438/48; 438/50; 438/700; 257/E21.546
(58) Field of Classification Search ............ 438/48–53, 438/700–701, 243–249, 386–392
See application file for complete search history.

(56) References Cited

U.S. PATENT DOCUMENTS 6,849,912 B2 * 2/2005 Bertz et al. ................ 257/417

FOREIGN PATENT DOCUMENTS

| JP | 2004106116 A | 4/2004 |
|---|---|---|
| KR | 2002-0085211 A | 11/2002 |

* cited by examiner

*Primary Examiner*—H. Jey Tsai
(74) *Attorney, Agent, or Firm*—Sughrue Mion, PLLC

(57) ABSTRACT

A method for fabricating a vertical offset structure that forms a complete vertical offset on a wafer includes a first trench forming step of forming first trenches on a wafer; a first etching step of performing a first patterning for determining etching positions of second and third trenches by depositing a first thin film on the wafer, performing a second patterning for temporarily protecting the etching position of the third trench by depositing a second thin film on the first thin film and the wafer, and then forming the second trenches by etching the wafer; a second etching step of forming a protection layer on side surfaces of the second trenches and then vertically extending the second trenches by etching the wafer; a third etching step of removing the second thin film and then forming the third trench by etching a position from which the second thin film is removed; and a fourth etching step of horizontally extending the second trenches vertically extended at the second etching step and the third trench by etching the wafer.

11 Claims, 10 Drawing Sheets

Unit pitch ically, the improvement of
METHOD FOR FABRICATING VERTICAL OFFSET STRUCTURE This application claims benefit under 35 U.S.C. § 119 from Korean Patent Application No. 2004-36507, filed on May 21, 2004, the entire content of which is incorporated herein by reference.

BACKGROUND OF THE INVENTION

1. Field of the Invention

The present invention relates to a method for fabricating a vertical offset structure, and more particularly to a method for fabricating a vertical offset structure by extending specified trenches using a single wafer.

2. Description of the Related Art

A vertical offset structure is fabricated using a MEMS (Micro Electro Mechanical System) fabrication method. The MEMS fabrication method relates to fabricating systems of the micrometer dimension on a wafer (i.e., substrate) using a silicon process, and is based on the method of fabricating semiconductor devices. Representative systems which are fabricated using the MEMS fabrication method are accelerometers for measuring acceleration of moving objects, gyroscopes for measuring angular velocity of rotating objects, optical switches capable of controlling optical paths, etc.

The performance indicator of the vertical offset structure is determined depending on whether upper and lower electrodes of the structure have a complete vertical offset and how narrow the vertical gap between the vertical offset structures is in order to improve the performance of vertical driving and detection.

FIG. 1 is a cross-sectional view illustrating an example of a conventional vertical offset structure. This vertical offset structure is disclosed in U.S. patent application Publication No. 2002/0158293A1. The vertical offset structure, in which structure members having different thickness have a vertical offset, has a good performance in applications of vertical driving and detection. However, according to the vertical offset structure as illustrated in FIG. 1, the vertical offset is not produced on an upper electrode of the structure, but is produced on a lower electrode thereof. Thus, the vertical offset structure as illustrated in FIG. 1 has a degraded performance in applications using vertical driving and detection.

FIG. 2 is a view illustrating another example of a conventional vertical offset structure. This vertical offset structure is disclosed in U.S. Pat. No. 6,694,504 B2. According to the vertical offset structure as illustrated in FIG. 2, a complete vertical offset is produced on both upper and lower electrodes. However, according to the principle of the fabrication process, the horizontal gap gh between the upper and lower electrodes of the structure is limited to about 4.5 μm. Since the horizontal gap is limited, the improvement of performance of the vertical offset structure is limited.

SUMMARY OF THE INVENTION

The present invention has been developed in order to address the above drawbacks and other problems associated with the conventional arrangement. An aspect of the present invention is to provide a method for fabricating a vertical offset structure which can achieve a complete vertical offset on upper and lower electrodes of the structure and narrow a gap between the upper and lower electrodes of the structure.

The foregoing and other objects and advantages are substantially realized by providing a method for fabricating a vertical offset structure, according to the present invention, which comprises a first trench forming step of forming first trenches on a wafer by etching the wafer and then injecting a specified material into the first trenches; a first etching step of performing a first patterning for determining etching positions of second and third trenches by depositing a first thin film on the wafer, performing a second patterning for temporarily protecting the etching position of the third trench by depositing a second thin film on the first thin film and the wafer, and then forming second trenches by etching the wafer; a second etching step of forming a protection layer on side surfaces of the second trenches and then vertically extending the second trenches by etching the wafer; a third etching step of removing the second thin film and then forming a third trench by etching a position from which the second thin film is removed; and a fourth etching step of horizontally extending the second trenches vertically extended at the second etching step and the third trench by etching the wafer.

It is preferable, but not necessary, that the method further comprises the step of removing the material injected into the first trenches, the first thin film and the protection layer.

It is preferable, but not necessary, that upper structures, a lower structure and a base structure are formed by the first trench forming step and the first to fourth etching steps, a vertical gap between the upper and lower structures is determined by the second trenches formed at the first etching step and the third trench, and a horizontal gap between the upper and lower structures is determined by the first trenches.

It is preferable, but not necessary, that the wafer is a single-crystalline wafer, and especially a single-crystalline wafer having a crystal orientation of (111).

It is preferable, but not necessary, that the material is made of SiO2, the first thin film is a SixNy thin film, and the second thin film is a SiO2 thin film.

It is preferable, but not necessary, that the first to third etchings are dry etchings, and the fourth etching is a wet etching. It is preferable, but not necessary, that the wet etching is performed in an alkaline solution.

The vertical offset structure fabricated using the method for fabricating the vertical offset structure is applicable to, for example, accelerometers, gyroscopes and optical application devices.

BRIEF DESCRIPTION OF THE DRAWINGS

The above aspects and features of the present invention will be more apparent by describing certain embodiments of the present invention with reference to the accompanying drawings, in which.

DETAILED DESCRIPTION OF THE PREFERRED EMBODIMENTS

Certain embodiments of the present invention will be described in greater detail with reference to the accompanying drawings.

Descriptions of items such as construction details and details of elements are only provided to assist in a comprehensive understanding of the invention. Thus, it is apparent that the present invention can be carried out without those details. Also, well-known functions or constructions are not described in detail since they would obscure the invention in unnecessary detail.

Figure 1:
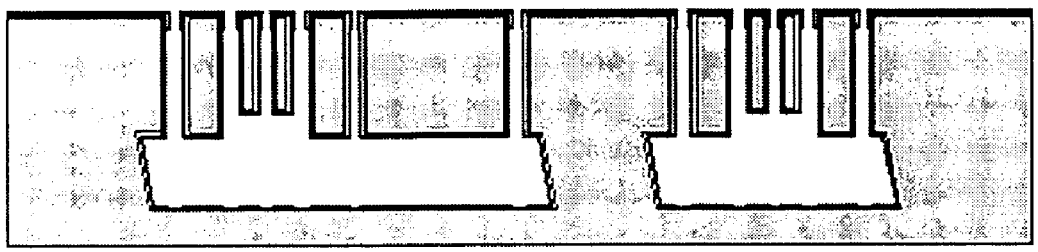
FIG. 1 is a cross-sectional view illustrating an example of a conventional vertical offset structure.
Figure 2:
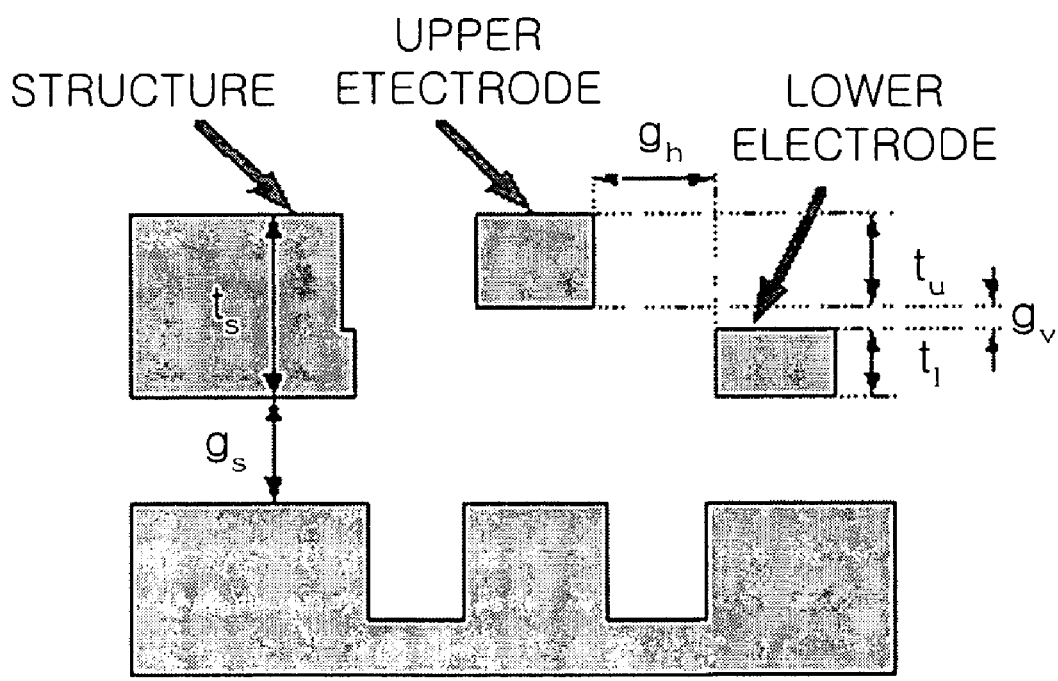
FIG. 2 is a view illustrating another example of the conventional vertical offset structure.
Figure 3:
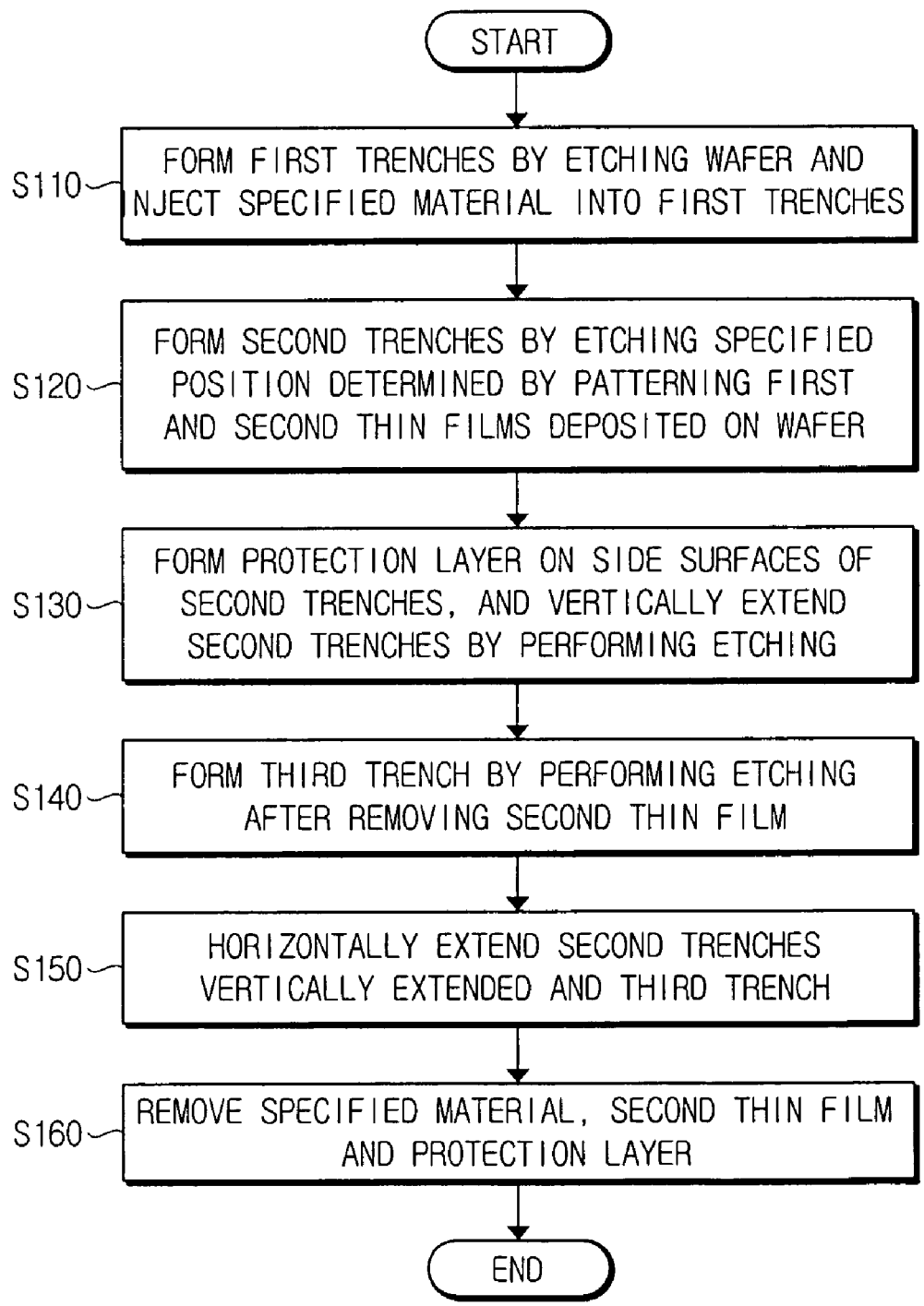
FIG. 3 is a flowchart illustrating a method for fabricating a vertical offset structure according to the present invention.
Figure 4A:
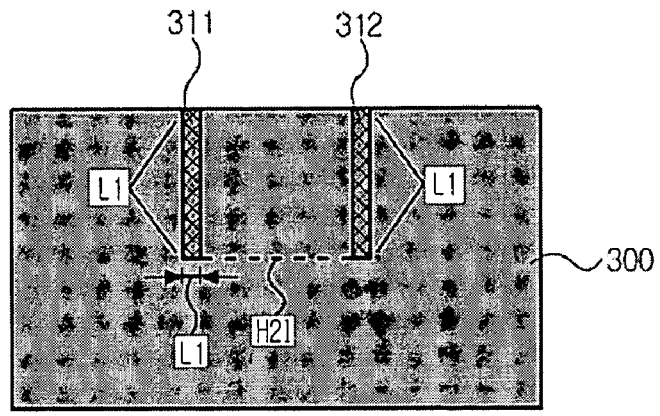
FIGS. 4A to 4F are cross-sectional views of a vertical offset structure according to fabrication steps of the vertical offset structure.
Figure 4B:
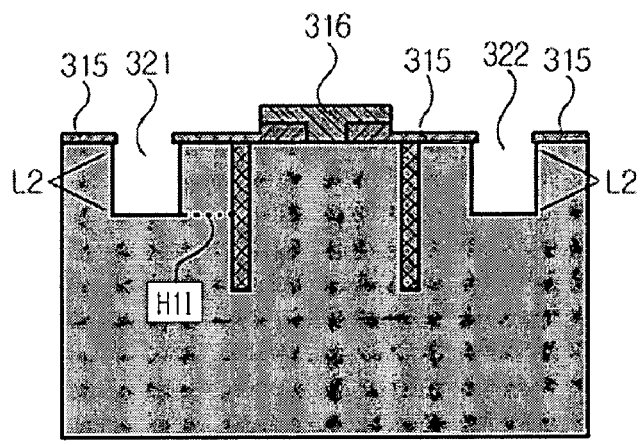
Figure 4C:
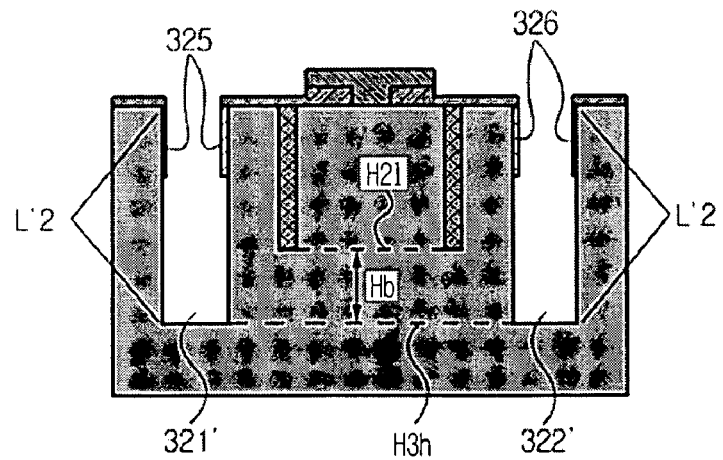
Figure 4D:
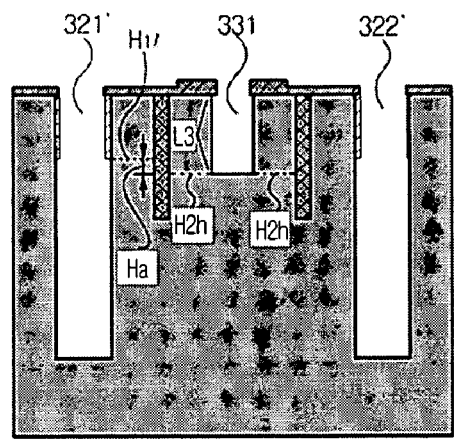
Figure 4E:
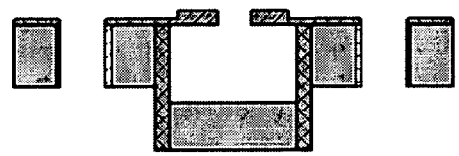
Figure 4E:
Figure 4F:
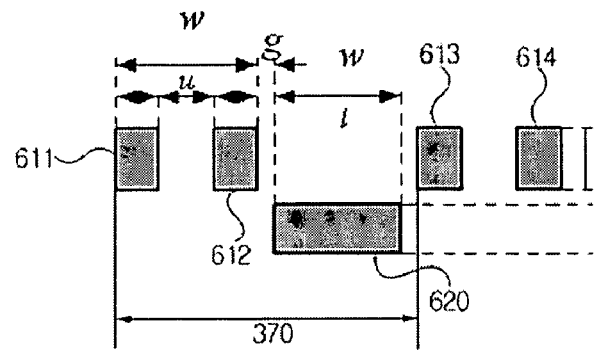
Figure 4F:
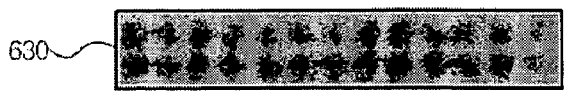
Figure 4G:
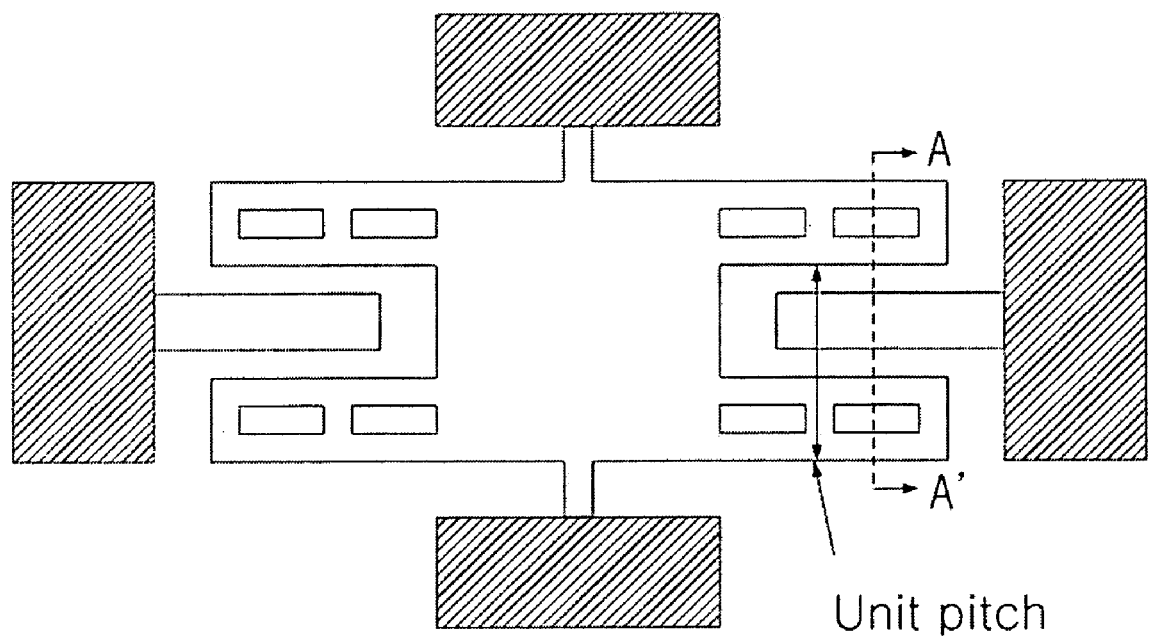
FIG. 4G is a plan view of the vertical offset structure illustrated in FIGS. 4A to 4F.

FIG. 3 is a flowchart illustrating a method for fabricating a vertical offset structure according to the present invention. FIGS. 4A to 4F are cross-sectional views of a vertical offset structure according to fabrication steps of the vertical offset structure. Referring to FIG. 4F, upper structures 611 to 614, a lower structure 620 and a base structure 630 fabricated by a method for fabricating a vertical offset structure according to an embodiment of the present invention are illustrated. The upper structures 611 to 614 and the lower structure 620 have a comb structure. FIG. 4G is a plan view of the vertical offset structure illustrated in FIGS. 4A to 4F. Referring to FIG. 4G, the section taken along the line A–A' is illustrated in FIGS. 4A to 4F. Also, a part of a unit pitch in FIG. 4F is illustrated in FIG. 4G. The part indicated as slanting lines is a part fixed when a voltage is applied. Referring to FIG. 4G, only a part centered about the unit pitch of the vertical offset structure according to the present invention is illustrated.

Figure 4H:
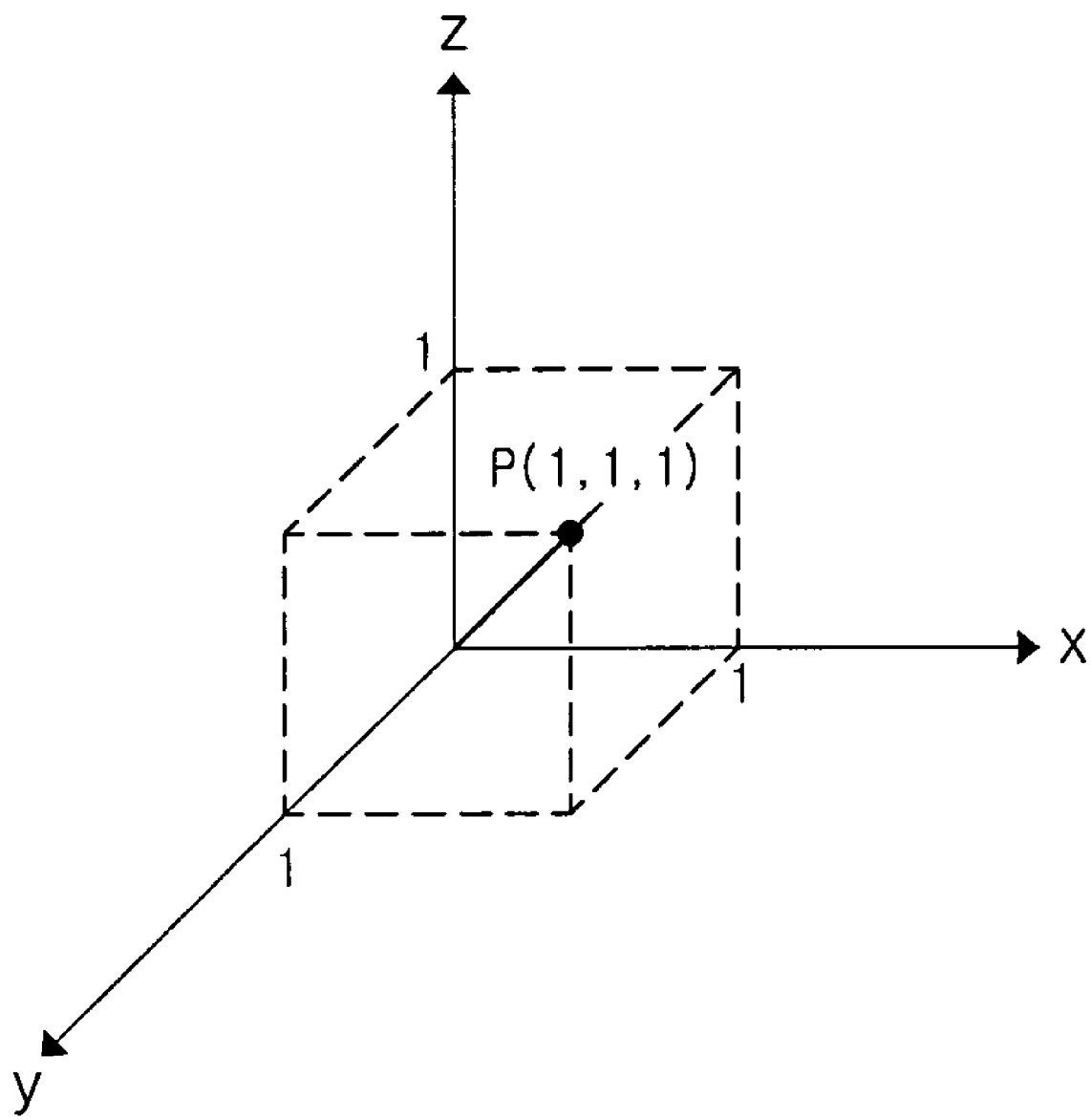
FIG. 4H is a view illustrating an example of a crystal orientation of a wafer used in the present invention.

Referring to FIG. 3, a predetermined number of first trenches are formed on a wafer (i.e., substrate) by an etching process, and a specified material is injected into the first trenches (step S110). The distance between the first trenches 311 and 312 becomes a width (i.e., horizontal length) of the lower structure 620. Referring to FIG. 4A, it is preferable that the wafer 300 is a single-crystalline wafer, but it is not limited thereto. FIG. 4H is a view illustrating an example of a crystal orientation of the wafer used in the present invention. It is preferable that the crystal orientation of the wafer is (111). Referring to FIG. 4H, the crystal orientation of (111) means a direction obtained by connecting the original point to a point P(111).

Referring to FIG. 4A, the first trenches 311 and 312 are illustrated by example. The lengths L1 of the first trenches 311 and 312 vertically formed on the wafer 300 by etching are equal to each other, and the horizontal line H21 that connects the lowermost parts of the first trenches 311 and 312 corresponds to the lower part of the lower structure. A specified material is injected into the first trenches 311 and 312, and preferably, this material is SiO2. The width g of the first trench 311 becomes the horizontal gap between the upper structures 612 and the lower structure 620. By adjusting the width g of the first trench 311, the horizontal gap can be narrowed.

A first patterning is performed through deposition of a first thin film on the wafer, a second patterning is performed through deposition of a second thin film on the wafer and the first thin film, and then second trenches are formed through etching of the wafer (step S120). By the first and second patterning, the second trenches 321 and 322 and the position 331 of a third trench are determined. Then, only the second trenches are formed through patterning of the second thin film 316. This is because the position 331 of the third trench on the wafer 300 is not etched due to the second thin film 316 deposited on the wafer. The length L2 of the second trenches 321 and 322 vertically formed on the wafer 300 by etching becomes the width of the upper structures 611 to 614. The lengths L2 of the second trenches 321 and 322 are equal to each other, and the horizontal line H11 that connects the lowermost parts of the second trenches 321 and 322 corresponds to the lower part of the upper structures 612. The upper part of the upper structures 611 to 614 becomes the upper end surface of the wafer 300. It is preferable to form the second trenches 321 and 322 into the wafer 300 by a dry etching. The trenches are formed in a vertical direction of the wafer 300 using the dry etching.

Figure 5:
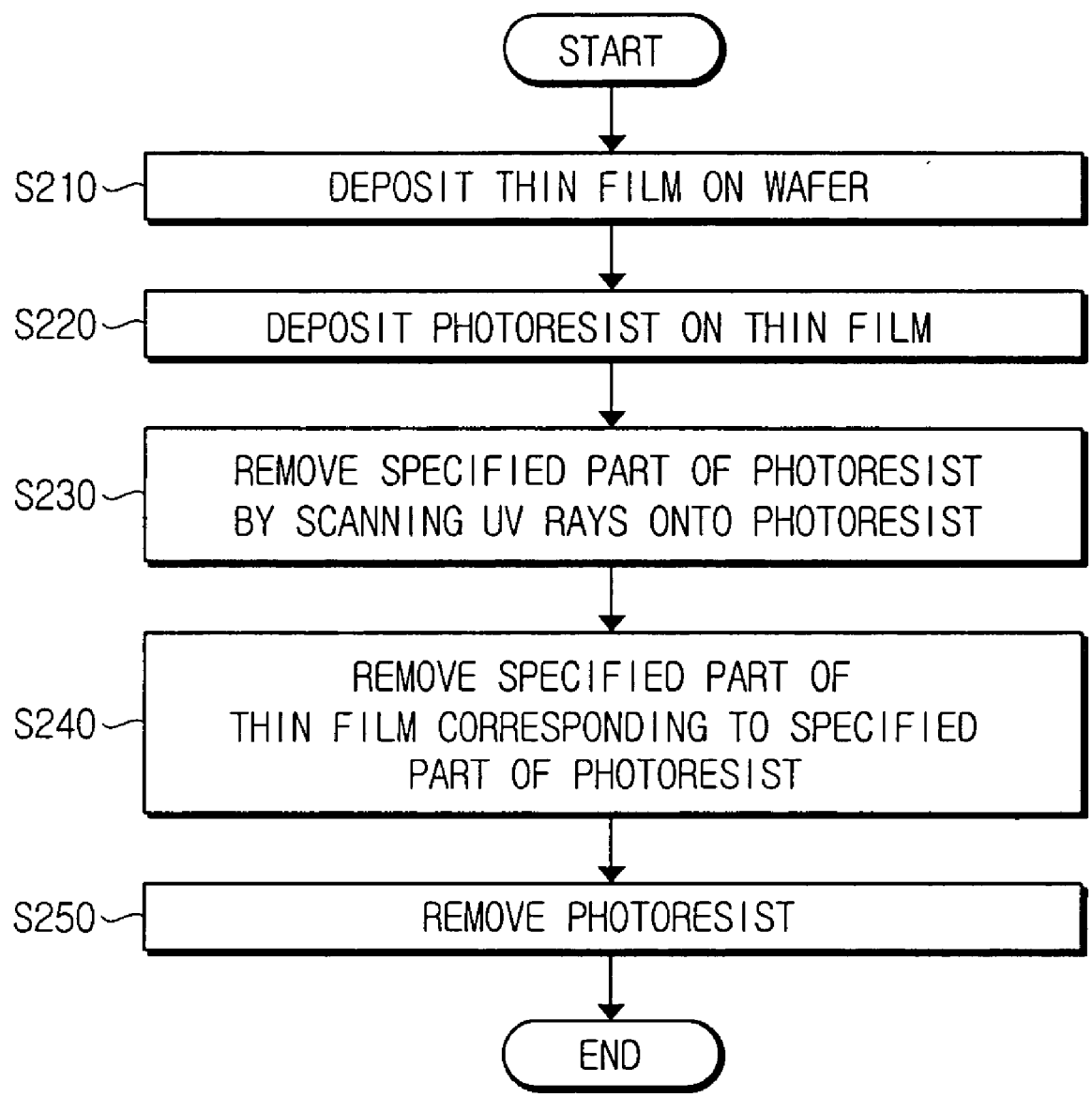
FIG. 5 is a flowchart illustrating an example of a patterning process used in the method for fabricating the vertical offset structure according to the present invention.

FIG. 5 is a flowchart illustrating an example of a patterning process used in the method for fabricating the vertical offset structure according to the present invention. FIGS. 6A to 6D are cross-sectional views of the structure according to the patterning process of FIG. 5. The thin-film patterning process will now be explained with reference to FIGS. 5 and 6A to 6D.

Figure 6A:
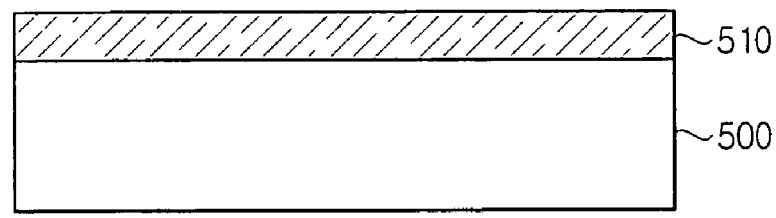
FIGS. 6A to 6D are cross-sectional views of the structure according to the patterning process of FIG. 5.
Figure 6B:
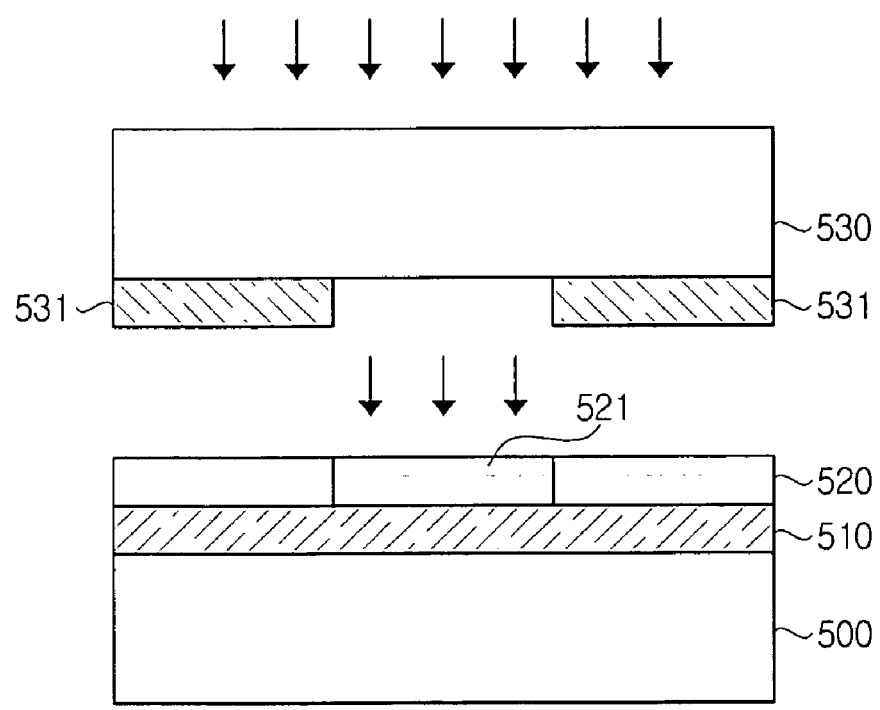
Figure 6C:
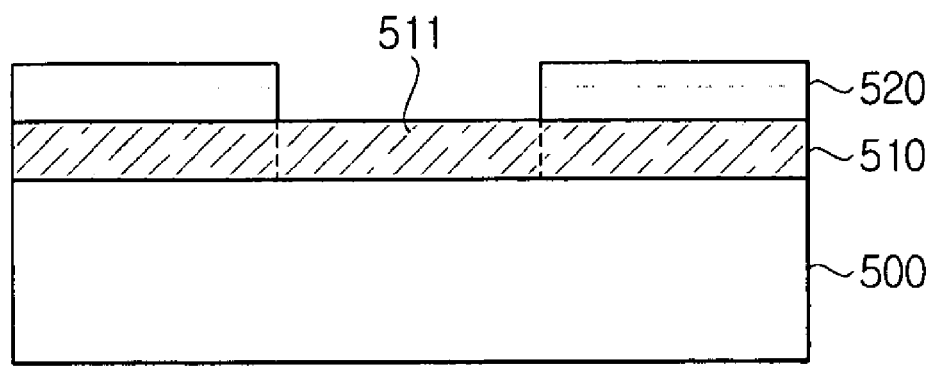
Figure 6D:
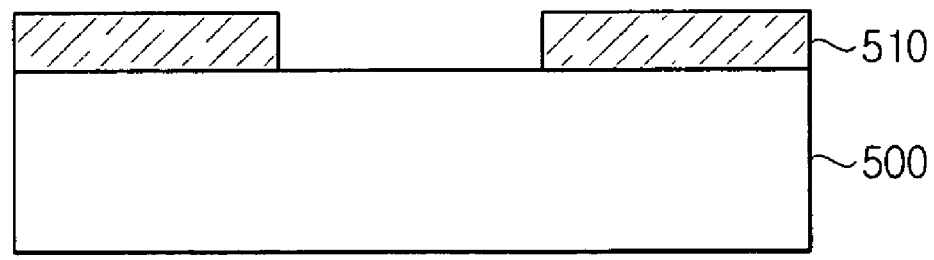

A thin film (i.e., etch mask thin film) 510 is deposited on a wafer 500 (step S210). After photoresist is deposited on the thin film 510, the photoresist 520 is patterned through scanning of ultraviolet (UV) rays (step S220). Referring to FIG. 6B, the UV rays are scanned on the photoresist 520 after penetrating a photo mask 530, but they cannot penetrate parts to which chrome 531 is attached. Accordingly, the UV rays penetrate only the parts of the photo mask 530, to which chrome 531 is not attached, and are scanned on the photoresist 520. Then, the patterned photoresist part 521 is removed, and the etching is performed (step S230). Referring to FIG. 6C, a thin film part 511 that corresponds to the patterned photoresist part 521 is removed by etching. Then, the thin film is patterned through removing of the photoresist part (step S240). Referring to FIG. 6D, the patterned thin film 512 is illustrated. Through the above-described processes, the thin film is patterned.

Referring again to FIGS. 3 and 4A to 4H, the second trenches 321 and 322 are vertically extended through the etching after protection layers 325 and 326 are formed on wall surfaces of the second trenches 321 and 322 (step S130). Referring to FIG. 4C, the reason why the protection layers 325 and 326 are formed is to facilitate the vertical extension of the second trenches 321 and 322. The vertical lengths L'2 of the second trenches 321' and 322' vertically extended are equal to each other, and the horizontal line H3h that connects the lowermost parts of the second trenches 321' and 322' corresponds to an upper part of the base structure 630. The distance Hb between the lower part of the lower structure 620 and the upper part of the base structure 630 is changed according to the vertical length L'2 of the second trenches 321' and 322'. Preferably, a dry etching is used to vertically extend the second trenches 321 and 322.

After the second thin film 316 is removed, the third trench 331 is formed through an etching process (step S140). Referring to FIG. 4D, the third trench 331 is formed in the position from which the second thin film (See 316 in FIG. 4B) is removed. Preferably, a dry etching is used to form the third trench 331. The line H2h horizontally extending the lowermost part of the third trench 331 corresponds to the upper part of the lower structure 620. The difference Ha between the lower part of the upper structures 612 and the upper part of the lower structure 620 is changed according to the vertical length L3 of the third trench 331.

Then, an etching for horizontally extending the second trenches 321' and 322' extended at the second etching step and the third trench 331 is performed (step S150). It is preferable that a wet etching is performed to horizontally extend the trenches, and the wet etching is performed in an alkaline solution. The cross section of the structure obtained as a result of wet etching is illustrated in FIG. 4E. If the thin films 315 and 316 and the protection layers 325 and 326, which are deposited on the structure obtained as a result of wet etching, are removed from the structure, a vertical offset structure having the structure as illustrated in FIG. 4F is obtained (step S160). In FIG. 4F, only a part of the vertical offset structure fabricated on the wafer 300 is illustrated. In other words, the vertical offset structure as illustrated in FIG. 4F is repeatedly formed, and a unit pitch 370 for such repetition is indicated in FIG. 4F. Referring to FIGS. 4A and 4F, it can be seen that the horizontal gap g between the upper structures 612 and the lower structure 620 is equal to the width of the first trench 311.

The vertical length L1 of the first trench, the vertical length L2 of the second trench formed at the first etching step, the vertical length L'2 of the second trenches vertically extended at the second etching step, and the vertical length L3 of the third trench are in the order of L'2>L1>L3>L2.

In this case, the lower part of the upper structures 611 to 614 is formed in a position that has a difference of L2 from the upper part of the wafer 300, and the thickness of the upper structures 611 to 614 corresponds to L2. The upper part of the lower structure 620 is formed in a position that has a difference of L3 from the upper part of the wafer 300, and the thickness of the lower structure 620 corresponds to a length obtained by subtracting L3 from L1. The upper part of the base structure 630 is formed in a position that has a difference of L'2 from the upper part of the wafer 300, and the thickness of the base structure 630 corresponds to a length obtained by subtracting L'2 from the width of the wafer 300. The horizontal gap between the upper structures 611 to 614 and the lower structure 620 corresponds to the width of the first trenches 311 and 312.

The vertical offset structure fabricated by the fabrication method according to the present invention has a complete vertical offset in comparison to the vertical offset structure of U.S. patent application Publication No. 2002/0158293A1, and can reduce the horizontal gap between the upper structures and the lower structure to 1/4.5 in comparison to the vertical offset structure of U.S. Pat. No. 6,694,504B2. In driving the vertical offset structure, for example, the upper structures and the lower structure may be driven with different voltages applied thereto. In this case, as the horizontal gap is narrower, they can be driven even with lower voltages, and a greater force is produced when the same voltage is applied to the upper and lower structures. Accordingly, the vertical offset structure according to the present invention has an improved effect in two respects as described above in comparison to the vertical offset structure of U.S. Pat. No. 6,694,504B2.

Table 1 below shows items of the vertical offset structure (SAIT) of U.S. patent application Publication No. 2002/0158293A1, the vertical offset structure (SNU) of U.S. Pat. No. 6,694,504B2 and the vertical offset structure (Proposed) according to the present invention for the purpose of comparison.

TABLE 1

| Version | SAIT | SNU | Proposed |
| --- | --- | --- | --- |
| Minimum possible gap between electrodes [μm] | ~2 | ~4.5 | <1 |
| Unit electrode pitch [μm] | ~11 | ~10 | ~12 |
| Electrode structure | Offset formed only on lower part of electrodes | Offset formed on both upper and lower parts of electrodes | Offset formed on both upper and lower parts of electrodes |

Figure 7:
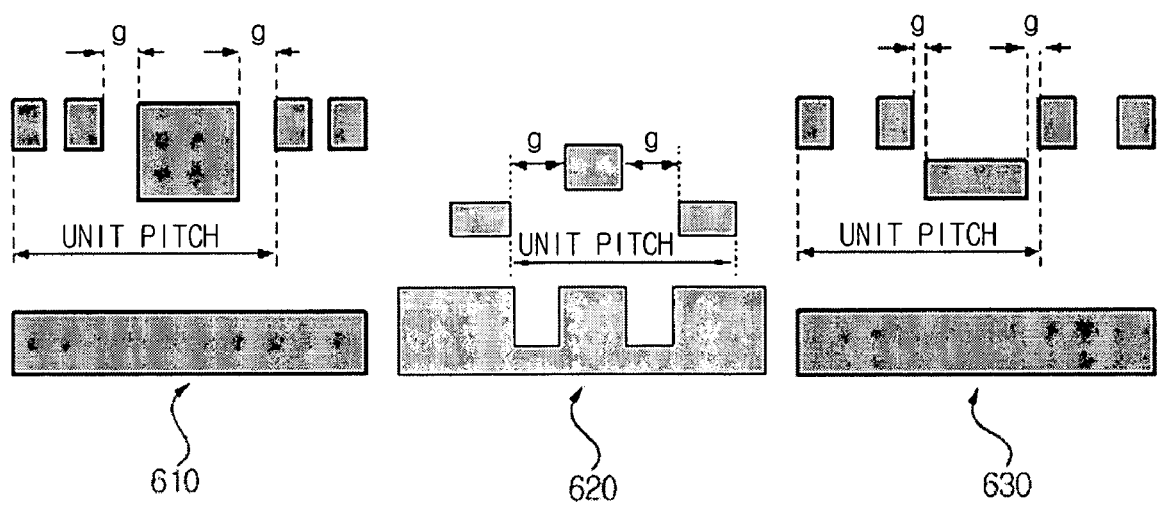
FIG. 7 is a view illustrating the conventional vertical offset structures and the vertical offset structure according to the present invention for the purpose of comparison.

The compared items are the number of masks, minimum possible gap between electrodes, unit electrode pitch, electrode cross-section structure, and the change of capacitance. FIG. 7 is a view illustrating the conventional vertical offset structures and the vertical offset structure according to the present invention for the purpose of comparison. Referring to FIG. 7, the vertical offset structure 610 of U.S. Patent Application Publication No. 2002/0158293A1, the vertical offset structure 620 of U.S. Pat. No. 6,694,504B2 and the vertical offset structure 630 according to the present invention are illustrated. In FIG. 7, the minimum possible gap g between electrodes, and the unit electrode pitch are also illustrated. The minimum possible gap g means the horizontal gap between the upper structures (i.e., upper electrodes) and the lower structure (i.e., lower electrode).

The vertical offset structure according to the present invention can be used as vertical combs for vertical driving and detection. Specifically, the vertical offset structure according to the present invention may be used to fabricate accelerometers, gyroscopes, micromirrors, etc. Research for the micromirrors has been widely carried out for displays, scanners, optical communications, etc.

As described above, according to the present invention, the vertical lengths of the second and third trenches are determined to be different from each other, and thus a vertical offset structure in which a complete vertical offset is produced between the upper and lower structures.

Also, according to the present invention, by adjusting the width of the first trench, the vertical offset structure, in which the horizontal gap between the upper and lower structures is greatly narrowed, can be provided.

Although in the embodiment of the present invention, the first to third trenches have been explained, the width and depth of the first trenches, second trenches, or third trench may be differently determined.

The foregoing embodiment and advantages are merely exemplary and are not to be construed as limiting the present invention. The present teaching can be readily applied to other types of apparatuses. Also, the description of the embodiments of the present invention is intended to be illustrative, and not to limit the scope of the claims, and many alternatives, modifications, and variations will be apparent to those skilled in the art.

What is claimed is:

1. A method for fabricating a vertical offset structure, comprising:
    a first trench forming step of forming first trenches on a wafer by etching the wafer and then injecting a specified material into the first trenches;
    a first etching step of performing a first patterning for determining etching positions of second and third trenches by depositing a first thin film on the wafer, performing a second patterning for temporarily protecting the etching position of the third trench by depositing a second thin film on the first thin film and the wafer, and then forming the second trenches by etching the wafer;

a second etching step of forming a protection layer on side surfaces of the second trenches and then vertically extending the second trenches by etching the wafer;

a third etching step of removing the second thin film and then forming the third trench by etching a position from which the second thin film is removed; and a fourth etching step of horizontally extending the second trenches vertically extended at the second etching step and the third trench by etching the wafer.

2. The method as claimed in claim 1, further comprising the step of removing the material injected into the first trenches, the first thin film and the protection layer.

3. The method as claimed in claim 1, wherein upper structures, a lower structure and a base structure are formed through the first trench forming step and the first to fourth etching steps;

a vertical gap between the upper and lower structures is determined by the second trenches formed at the first etching step and the third trench; and a horizontal gap between the upper and lower structures is determined by the first trenches.

4. The method as claimed in claim 1, wherein the wafer is a single-crystalline wafer.

5. The method as claimed in claim 1, wherein the wafer is a single-crystalline wafer having a crystal orientation of (111), which means a direction obtained by connecting the original point to a point P(111).

6. The method as claimed in claim 1, wherein the material is made of $SiO_2$.

7. The method as claimed in claim 1, wherein the first thin film is a $Si_xN_y$ thin film.

8. The method as claimed in claim 1, wherein the second thin film is a $SiO_2$ thin film.

9. The method as claimed in claim 1, wherein the first to third etching are dry etchings.

10. The method as claimed in claim 9, wherein the fourth etching is a wet etching.

11. The method as claimed in claim 10, wherein the wet etching is performed in an alkaline solution.

* * * * *